(12) United States Patent
Seki et al.

(10) Patent No.: US 6,472,902 B2
(45) Date of Patent: Oct. 29, 2002

(54) SEMICONDUCTOR DEVICE

(75) Inventors: Hiroshi Seki; Ayako Katsuno, both of Suwa (JP)

(73) Assignee: Seiko Epson Corporation, Tokyo (JP)

( * ) Notice: Subject to any disclaimer, the term of this patent is extended or adjusted under 35 U.S.C. 154(b) by 46 days.

(21) Appl. No.: 09/809,280

(22) Filed: Mar. 16, 2001

(65) Prior Publication Data

US 2001/0025967 A1 Oct. 4, 2001

(30) Foreign Application Priority Data

Mar. 16, 2000 (JP) ........................................ 2000-074189
Jan. 5, 2001 (JP) ........................................ 2001-000676

(51) Int. Cl.[7] .............................................. H03K 19/00
(52) U.S. Cl. ........................................... 326/16; 326/38
(58) Field of Search ................................ 326/10, 37, 38

(56) References Cited

U.S. PATENT DOCUMENTS 5,453,993 A * 9/1995 Kitaguchi et al. ......... 324/73.1
5,559,744 A * 9/1996 Kuriyama et al. ........... 365/201
5,740,219 A * 4/1998 O'Dell ......................... 377/29

* cited by examiner

*Primary Examiner*—Michael Tokar
*Assistant Examiner*—Don P H Le
(74) *Attorney, Agent, or Firm*—Oliff & Berridge, PLC

(57) ABSTRACT

A semiconductor device is provided having an internal circuit in which input data is gated and supplied to the internal circuit according to an internal control signal generated within the semiconductor device. The semiconductor device has N number (N being two or greater integers) of data input terminals for inputting input data, and a test mode input terminal for inputting a test mode signal. An OR device is provided for obtaining a logical sum of the internal control signal and the test mode signal. The semiconductor device also has N number of gate circuits that are supplied with the input data applied to the N data input terminals, respectively. When an output of the OR device is active, those of the N gate circuits responsive to the output of the OR device pass the input data applied to the data input terminals. The internal circuit is supplied with outputs of the N gate circuits.

10 Claims, 4 Drawing Sheets

SEMICONDUCTOR DEVICE

BACKGROUND OF THE INVENTION

1. Field of Invention

The present invention generally relates to semiconductor devices equipped with a test mode and a method for operating the same. More particularly, the present invention relates to a semiconductor device with a built-in measurement circuit that supports examinations of the semiconductor device when the semiconductor device is examined by a test apparatus such as an IC tester in a test mode.

2. Description of Related Art

FIG. 3 shows a conventional semiconductor device. In the semiconductor device shown in FIG. 3, buffer circuits 101, 102, 103, . . . , each having two inverters, are inserted as input circuits between input terminals 1, 2, 3,. . . and an internal circuit 30.

As shown in FIG. 3, when input data is applied to the input terminals 1, 2, 3, . . . from a test apparatus such as an IC tester, the input data is supplied to the internal circuit 30 through the buffer circuits 101, 102, 103, . . . , respectively. Therefore, when this type of semiconductor device is examined by using the test apparatus, logic levels to be inputted in the internal circuit need to be measured. For this purpose, it is proposed to provide a measurement circuit that operates in a test mode within the semiconductor device, to thereby measure logic levels that are inputted in the internal circuit. In the semiconductor device shown in FIG. 3, for example, AND circuits 21, 22, 23, . . . , each including a NAND gate and an inverter, are provided as measurement circuits.

The AND circuits are connected to a series of the data input terminals in a chain like manner. More particularly, for example, input data from the second data input terminal 2 is supplied through the buffer circuit 102 to one of two inputs of the second AND circuit 22. Also, an output from the AND circuit 21 that is connected to the second AND circuit 22 in an immediately proceeding stage is supplied to the other input of the AND circuit 22. Furthermore, an output of the AND circuit 22 is supplied to one input of the AND circuit 23, and input data from the third data input terminal 3 is inputted to the other input of the AND circuit 23. In this manner, the multiple AND circuits are connected in a chain-like manner.

A test mode signal TEST is supplied through a test mode signal input terminal 60 to one input of the AND circuit 21 in the first stage. The test mode signal TEST is at high level in a test mode. Also, an output of one of the AND circuits in the last stage is supplied to one input of a selection circuit 70. An output of the internal circuit 30 is supplied to the other input of the selection circuit 70. The selection circuit 70 is controlled by the test mode signal TEST. The selection circuit 70 selects the output of the internal circuit 30 in a normal operation mode, and selects the output of the AND circuit in the last stage in a test mode. An output of the selection circuit 70 is read out through an output terminal 80 by an external device.

It is noted that, in the normal operation mode, the test mode signal TEST is at low level. Therefore, outputs from the AND circuits 21, 22, 23, . . . are at low level without regard to the level of the input data. On the other hand, the test mode signal TEST is at high level in the test mode. Therefore, when input data on input systems other than an input system that is subject to measurement are fixed at high level, and the logic level of input data (for example, input data applied to the data input terminal 1) in the input system that is subject to measurement is changed, the logic level inputted in the input system of the internal circuit 30 is accordingly changed. The change is transferred through the AND circuits 21, 22, 23, . . . that are connected in a chain-like manner, and outputted through the selection circuit 70 and then through the output terminal 80. In this manner, the logic level of an input within the internal circuit 30 can be measured without regard to differences in the specification of the input circuits of the semiconductor device.

SUMMARY OF THE INVENTION

When the buffer circuits are used as input circuits in a manner shown in FIG. 3, a problem occurs when a power supply to a separate system that supplies input data is tuned off. In other words, in such an instance, the data input terminals of the semiconductor device are placed in a high-impedance state, an input to the buffer circuits may have a potential close to an intermediate potential between a power supply potential $V_{DD}$ and a power supply voltage $V_{SS}$, i.e., a value of $(V_{DD}+V_{SS})/2$. Alternatively, an input to the buffer circuits may have a potential close to a value of $V_{DD}/2$ when a power supply voltage $V_{SS}$ is at a grounding potential. As a result, a drain current may constantly flow through the inverters that form the buffer circuits.

In order to prevent wasteful current from flowing even in the instance described above, some techniques are proposed. For example, an AND circuit 11 shown in FIG. 4 or an OR circuit 91 shown in FIG. 5 is used to form an input circuit instead of the buffer circuit 101 used in the semiconductor device shown in FIG. 3.

Referring to FIG. 4, the AND circuit 11 includes a NAND gate and an inverter. One of input terminals of the NAND gate is connected to the data input terminal 1. The other input terminal of the NAND gate is supplied with a control signal C that is internally generated in the semiconductor device. Even when the data input terminal 1 is placed in a high-impedance state, an output of the NAND gate of the AND circuit 11 is always at high level if the control signal C is maintained at low level. Therefore, wasteful current does not flow.

Referring to FIG. 5, the OR circuit 91 includes a NOR gate and an inverter. One of input terminals of the NOR gate is connected to the data input terminal 1. The other input terminal of the NOR gate is supplied with a control signal C bar that is internally generated in the semiconductor device. Even when the data input terminal 1 is placed in a high-impedance state, an output of the NOR gate of the OR circuit 91 is always at low level if the control signal C bar is maintained at high level. Therefore, wasteful current does not flow.

However, when the semiconductor device having an input circuit that is formed with the AND circuit 11 shown in FIG. 4 is tested, the output of the AND circuit 11 is fixed at low level and does not change even when the logic level on the data input terminal 1 is changed, unless the control signal C is changed to high level. Also, when the semiconductor device having an input circuit that is formed with the OR circuit 91 shown in FIG. 5 is tested, the output of the OR circuit 91 is fixed at high level and does not change even when the logic level on the data input terminal 1 is changed, unless the control signal C bar is changed to low level.

Accordingly, when the AND circuit 11 shown in FIG. 4 or the OR circuit 91 shown in FIG. 5 is inserted in an input system of the semiconductor device having a measurement circuit that uses the AND circuits 21, 22, 23, . . . shown in FIG. 3, the logic level of an input in the input circuit cannot be measured unless the internal control signal is changed.

In view of the above, it would be desired to provide a semiconductor device having an input circuit and a method for operating the same, in which the logic level of an input on the input circuit can be measured by a test apparatus such as an IC tester even when a gate circuit that uses an internally generated control signal is used in a first stage of the input circuit.

A semiconductor device in accordance with one exemplary embodiment of the present invention has an internal circuit in which input data is gated and supplied to the internal circuit according to an internal control signal generated within the semiconductor device. The semiconductor device has N number (N being two or greater integers) of data input terminals for inputting input data, and a test mode input terminal for inputting a test mode signal. An OR device is provided for obtaining a logical sum of the internal control signal and the test mode signal. The semiconductor device also has N number of gate circuits that are supplied with the input data applied to the N data input terminals, respectively. When an output of the OR device is active, those of the N gate circuits responsive to the output of the OR device pass the input data applied to the data input terminals. The internal circuit is supplied with outputs of the N gate circuits. The semiconductor device has a first stage AND device and second through Nth stage AND devices. The first stage AND device has a first input that is supplied with an output of a first one of the N gate circuits and a second input that is supplied with the test mode signal. The second through Nth stage AND devices respectively have first input terminals that are supplied with outputs of second through Nth ones of the N gate circuits, respectively, and second input terminals that are supplied with outputs of the first through (N–1)th stage AND devices, respectively.

The semiconductor device may further include a selection circuit that selects an output of the internal circuit in a normal operation mode and selects an output of the Nth stage AND device in a test mode, and an output terminal that is supplied with an output of the selection circuit.

In the semiconductor device, the internal control signal and an output of the OR device may be active at high level. Alternatively, the internal control signal and an output of the OR device may be active at low level.

By a semiconductor device having the structure described above in accordance with the embodiment of the present invention, even when a gate circuit that uses an internally generated control signal is used in one of the input circuits in the first stage thereof, the operation of the gate circuit can be controlled by using a test mode signal. Therefore, the logic level of an input in the input circuits can be measured by using a test apparatus such as an IC tester.

Other features and advantages of the invention will be apparent from the following detailed description, taken in conjunction with the accompanying drawings that illustrate, by way of example, various features of embodiments of the invention.

DETAILED DESCRIPTION OF PREFERRED EMBODIMENTS

Preferred exemplary embodiments of the present invention will be described below with reference to the accompanying drawings.

Figure 1:
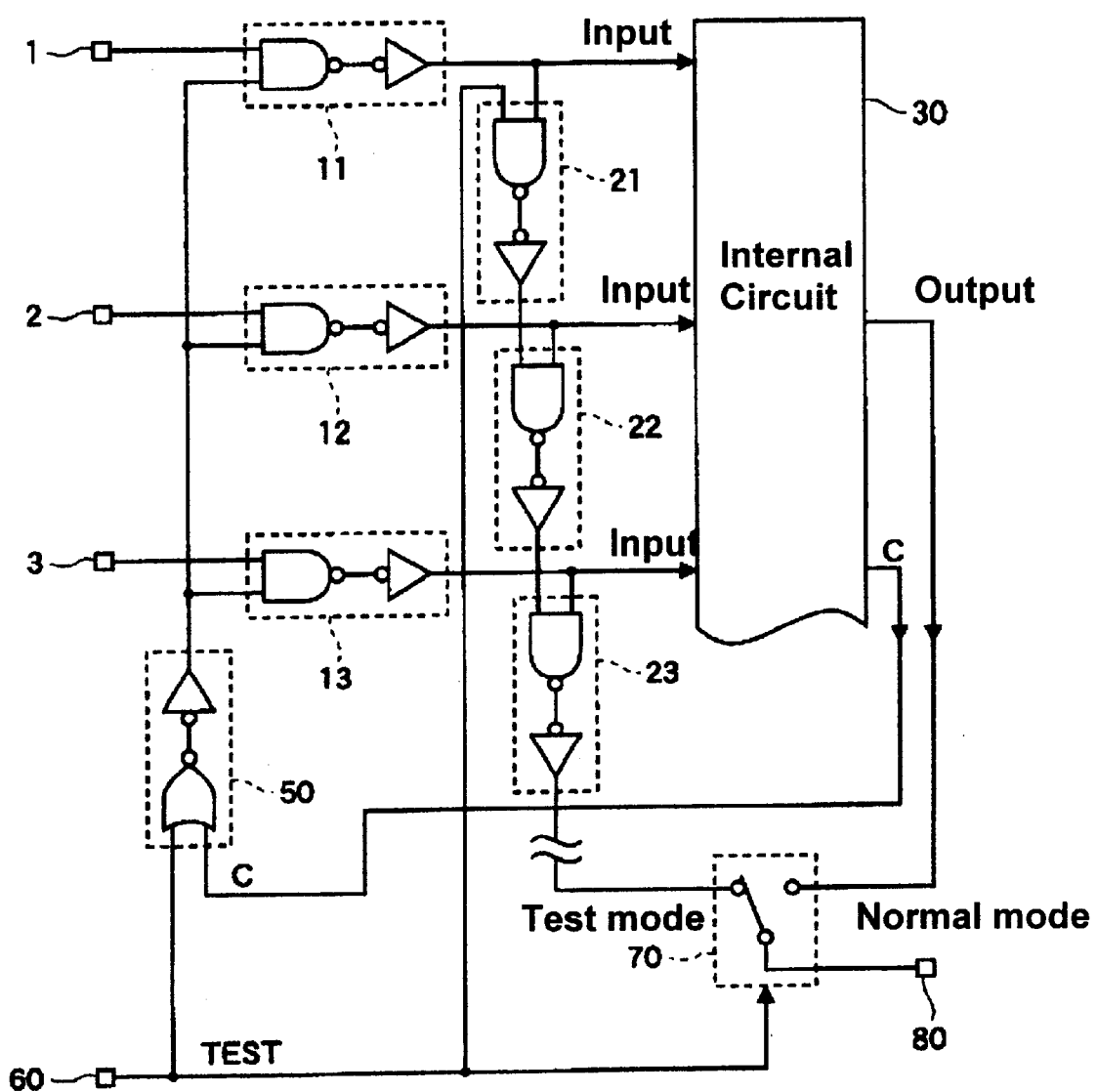
FIG. 1 schematically shows a structure of a semicoductor device in accordance with a first exemplary embodiment of the present invention.

FIG. 1 shows a structure of a semiconductor device in accordance with a first exemplary embodiment of the present invention. Referring to FIG. 1, the semiconductor device has a plurality of data input terminals 1, 2, 3, . . . , N. It is noted that FIG. 1 shows only three data input terminals, and fourth through Nth data input terminals are omitted to simplify the illustration. Input data are inputted to the respective data input terminals 1, 2, 3, . . . , N from an external test apparatus. Also, the semiconductor device also has a test mode signal input terminal 60. A test mode signal TEST that is at high level in a test mode is supplied to the test mode signal input terminal 60 from the external test apparatus.

The semiconductor device of the present embodiment includes AND circuits 11, 12, 13, . . . N as gate circuits that gate the input data. The input data applied to the data input terminals 1, 2, 3, . . . , N are supplied to an internal circuit 30 of the semiconductor device through the AND circuits 11, 12, 13, . . . N that provide logical multiplication of the input data and an internal control signal C. It is noted that FIG. 1 shows only three AND circuits 11, 12, 13 as gate circuits, and fourth through Nth AND circuits are omitted to simplify the illustration. Each of the AND circuits 11, 12, 13, . . . . N include a NAND gate and an inverter. Input data is supplied to one of two inputs of each of the NAND gates from the corresponding one of the data input terminals, and an output from an OR circuit 50 is inputted in the other input of each of the NAND gates. The OR circuit 50 includes a NOR gate and an inverter. The internal control signal C that is internally generated in the internal circuit 30 is inputted in one of two inputs of the NOR gate of the OR circuit 50 and the test mode signal TEST is inputted to the other input of the NOR gate of the OR circuit 50. The OR circuit 50 provides a logical sum of the internal control signal C and the test mode signal TEST.

Even when the internal control signal C is normally at low level in the test mode, the test mode signal TEST is at high level. As a result, the output of the OR circuit 50 is at high level. Therefore, when the logic levels of the data input terminals 1, 2, 3, . . . , N are changed, outputs of the AND circuits 11, 12, 13, . . . . N are accordingly changed.

Furthermore, the semiconductor device includes AND circuits 21, 22, 23, . . . , N as measurement circuits within the semiconductor device.

Each of the AND circuits 21, 22, 23, . . . . N includes a NAND gate and an inverter. It is noted that FIG. 1 shows only three AND circuits 21, 22, 23 as measurement circuits within the semiconductor, and fourth through Nth AND circuits are omitted to simplify the illustration.

A first one (21) of the AND circuits as measurement circuits has a first input that is supplied with an output of a first one (11) of the AND circuits as gate circuits and a second input that is supplied with the test mode signal.

Second one (22) through Nth AND circuits as measurement circuits have first inputs that are supplied with outputs of the second (12) through Nth ones of the AND circuits as gate circuits, respectively, and second inputs that are supplied with outputs of immediately preceding ones of the AND circuits as measurement circuits (i.e., the AND circuit 21 through (N–1)th AND circuit), respectively.

In one embodiment, for example, input data from the second data input terminal 2 is supplied through the AND circuit 12 (i.e., second gate circuit) to one of two inputs of the second stage AND circuit 22. Also, an output from the AND circuit 21 in an immediately proceeding stage is supplied to the other input of the AND circuit 22. Furthermore, an output of the AND circuit 22 is supplied to one of two inputs of the AND circuit 23 in the next stage, and input data from the third data input terminal 3 is inputted to the other input of the AND circuit 23. In this manner, the multiple AND circuits are connected to one another in a chain-like manner.

The test mode signal TEST is supplied to one of two inputs of the AND circuit 21 in the first stage. Also, an output of the AND circuit in the measurement circuits in the last stage (i.e., the Nth stage AND circuit) is supplied to one of two inputs of a selection circuit 70. An output of the internal circuit 30 is inputted to the other input of the selection circuit 70. The selection circuit 70 is controlled by the test mode signal TEST. The selection circuit 70 selects the output of the internal circuit 30 in a normal operation mode, and selects the output of the AND circuit in the last stage in a test mode. An output of the selection circuit 70 is read out through an output terminal 80 by an external device.

It is noted that, in the normal operation mode, the test mode signal TEST is at low level. Therefore, outputs from the AND circuits 21, 22, 23, . . . , N are at low level without regard to the level of the input data. On the other hand, the test mode signal TEST at high level is provided in the test mode. Therefore, when input data on the input systems other than the input system that is subject to measurement is fixed at high level, and the logic level of input data on the input system that is subject to measurement is changed, the change is transferred through the AND circuits 21, 22, 23, . . . , N that are connected in a chain-like manner and through the selection circuit 70, and outputted from the output terminal 80. In this manner, inputted logic levels on the AND circuits 11, 12, 13, . . . , N can be measured without regard to variations in the specification of the input circuits of the semiconductor device.

Figure 2:
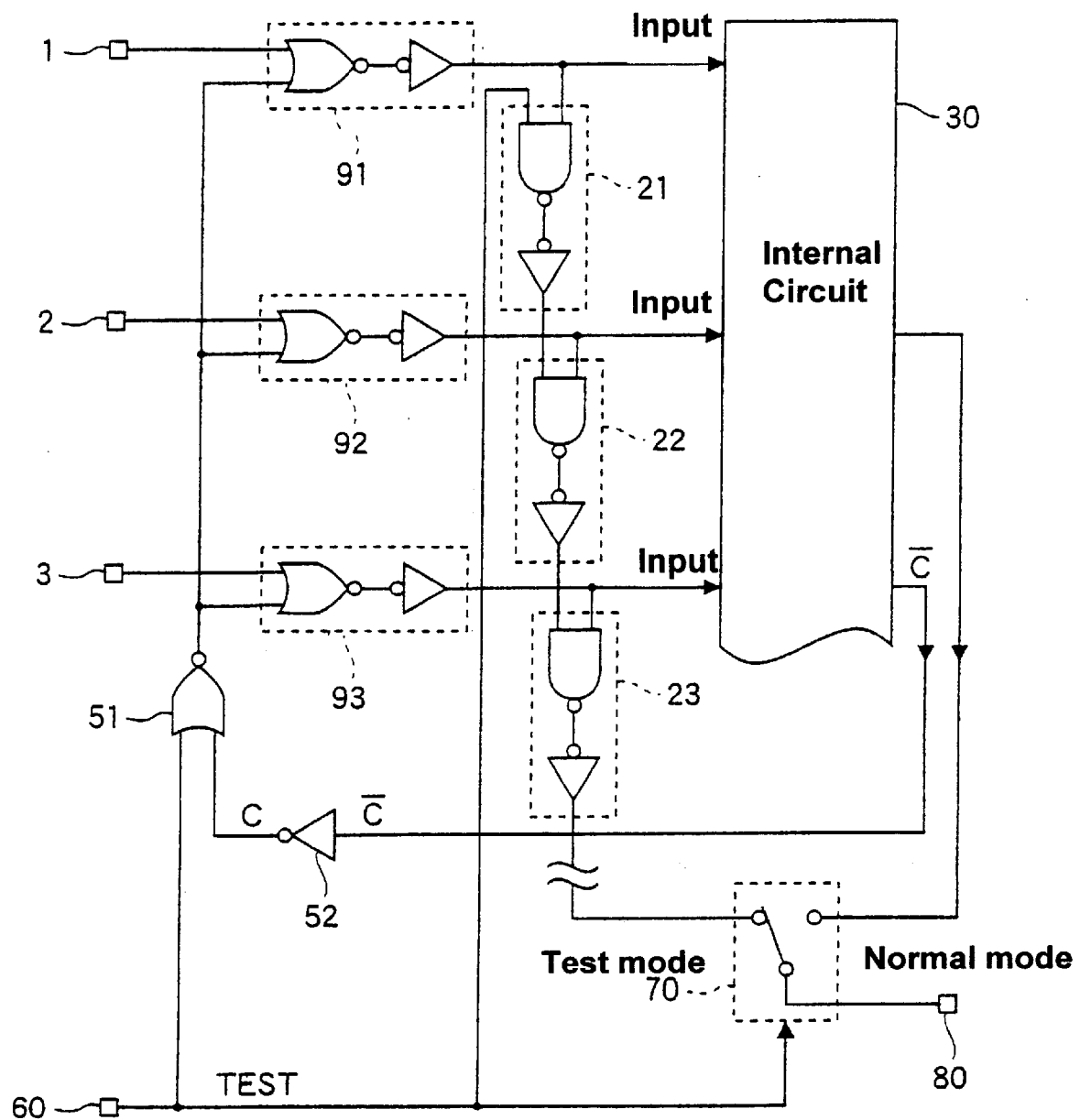
FIG. 2 schematically shows a structure of a semiconductor device in accordance with a second exemplary embodiment of the present invention.
Figure 3:
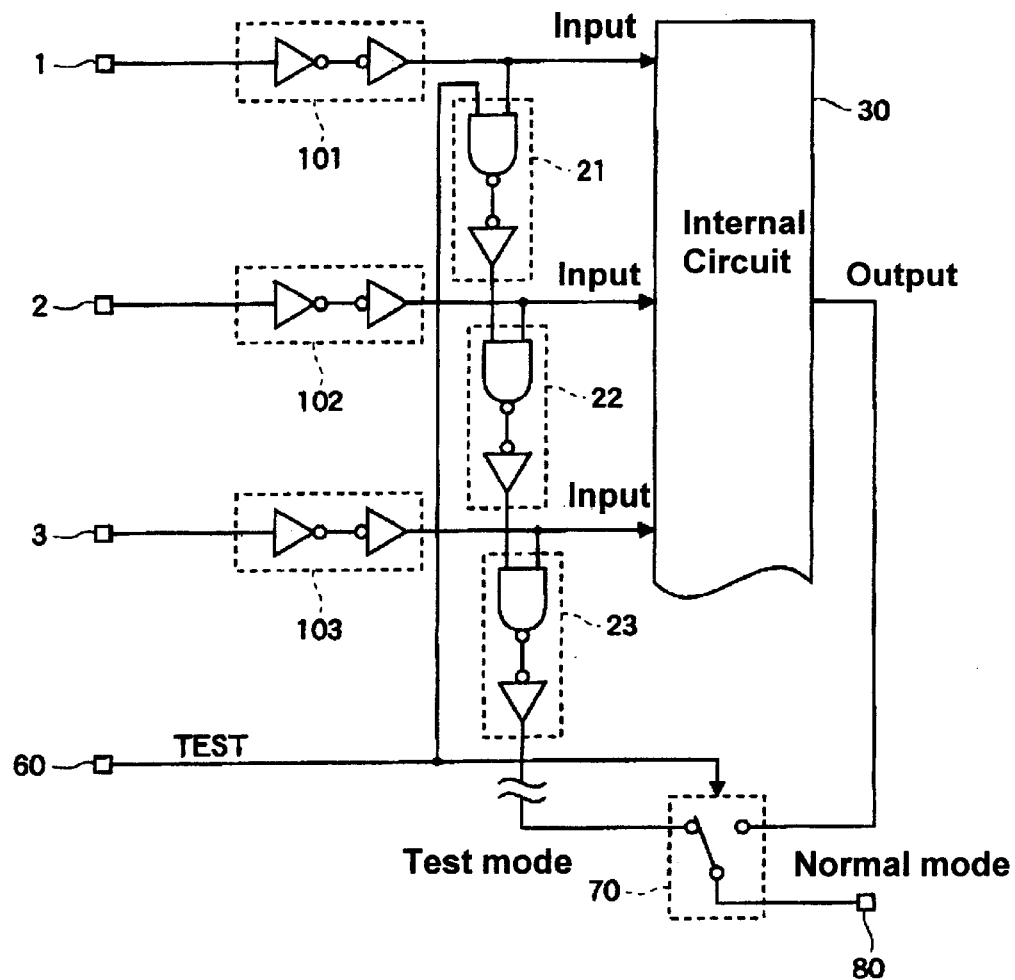
FIG. 3 schematically shows a structure of a semiconductor device including buffer circuits in an input system.
Figure 4:
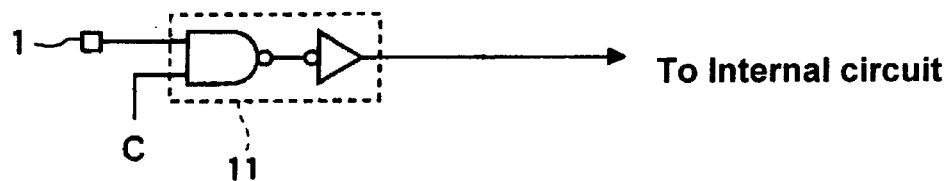
FIG. 4 shows an example of a gate circuit that is inserted in the input system of the semiconductor device.
Figure 5:
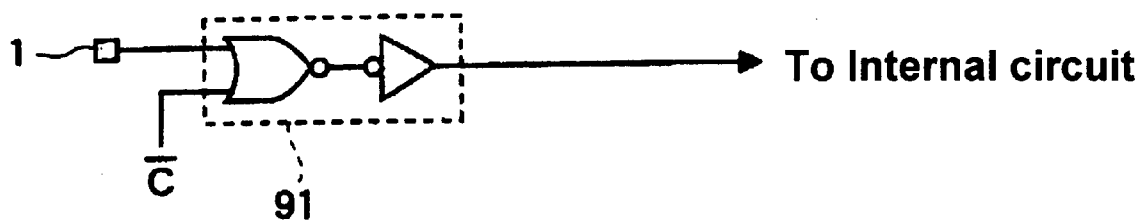
FIG. 5 shows another example of a gate circuit that is inserted in the input system of the semiconductor device.

Next, a second exemplary embodiment of the present invention is described below with reference to FIG. 2. The second embodiment is different from the first embodiment in that OR circuits are used instead of the AND gates as gate circuits.

The semiconductor device of the second embodiment includes OR circuits 91, 92, 93, . . . N as gate circuits that gate the input data. The input data applied to the data input terminals 1, 2, 3, . . . , N are supplied to an internal circuit 30 of the semiconductor device through the OR circuits 91, 92, 93, . . . N that provide logical sums of the input data and an internal control signal C bar. It is noted that FIG. 2 shows only three OR circuits 91, 92, 93 as gate circuits, and fourth through Nth OR circuits are omitted to simplify the illustration. Each of the OR circuits 91, 92, 93, . . . N include a NOR gate and an inverter. Input data is supplied to one of two inputs of each of the NOR gates of the respective OR circuits 91, 92, 93, . . . N from the corresponding one of the data input terminals, and an output from a NOR gate 51 is inputted in the other input of each of the NOR gates of the respective OR circuits 91, 92, 93, . . . N. The internal control signal C bar that is internally generated in the internal circuit 30 is supplied through an inverter 52 to one of two inputs of the NOR gate 51, and the test mode signal TEST is supplied to the other input of the NOR gate 51. The inverter 52 inverts the internal control signal C bar to form an internal control signal C. The NOR gate 51 provides a logical sum of the internal control signal C and the test mode signal TEST, inverts its result and outputs the same.

When the internal control signal C bar is normally at high level in a test mode, the test mode signal TEST is at high level, and therefore an output of the NOR gate 51 is at low level. As a result, when logic levels on the data input terminals 1, 2, 3, . . . , N are changed, outputs of the gate circuits 91, 92, 93, . . . , N are accordingly changed.

The semiconductor device of the second embodiment has AND circuits 21, 22, 23, . . . , N, each including a NAND gate and an inverter, a selection circuit 70, and an output terminal 80, in a similar manner as the first embodiment. Also, the semiconductor device of the second embodiment measures the logic levels of inputs to the internal circuit 30 in a similar manner conducted in the first embodiment.

It is noted that, in the exemplary embodiments described above, one type of internal control signal is used. However, the present invention is also applicable to other cases in which a plurality of internal control signals are used. In such cases, OR circuits in FIG. 1 or NOR gates 51 and inverters 52 in FIG. 2 may be provided in the same number of the internal control signals, respectively.

In accordance with the present invention, even when a gate circuit that uses an internal control signal is used in one of the input circuits in the first stage thereof, the operation of the gate circuit can be controlled by using a test mode signal. Therefore, the logic level of an input in the input circuits can be measured by using a test apparatus such as an IC tester.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A semiconductor device in which input data is gated according to an internal control signal generated within the semiconductor device, the semiconductor device comprising:

N number of data input terminals for inputting input data, where N is an integer that is two or greater;

a test mode input terminal for inputting a test mode signal;

an OR device that obtains a logical sum of the internal control signal and the test mode signal;

N number of gate circuits that are supplied with the input data applied to the N data input terminals, respectively, the N gate circuits passing the input data applied to the data input terminals when an output of the OR device is active;

an internal circuit that is supplied with outputs of the N gate circuits;

a first stage AND device having a first input that is supplied with an output of a first one of the N gate circuits and a second input that is supplied with the test mode signal; and second through Nth stage AND devices respectively having first inputs that are supplied with outputs of second through Nth ones of the N gate circuits, respectively, and second inputs that are supplied with outputs of immediately preceding ones of the first through Nth stage AND devices, respectively.

2. The semiconductor device according to claim 1, further comprising a selection circuit that selects an output of the internal circuit in a normal operation mode and that selects an output of the Nth stage AND device in a test mode, and an output terminal that is supplied with an output of the selection circuit.

3. The semiconductor device according to claim 1, the second inputs of the second through Nth stage AND devices being supplied with outputs of the first through (N−1)th stage AND devices, respectively.

4. The semiconductor device according to claim 1, the internal control signal and an output of the OR device being active at a high level.

5. The semiconductor device according to claim 1, the internal control signal and an output of the OR device being active at a low level.

6. A semiconductor device, comprising:

N number of data input terminals for inputting input data, where N is an integer that is two or greater;

a test mode input terminal for inputting a test mode signal;

an OR device that obtains a logical sum of an internal control signal and the test mode signal;

N number of gate circuits that are supplied with the input data applied to the N data input terminals, respectively, and an output of the OR device;

an internal circuit that is supplied with outputs of the N gate circuits, and that outputs the internal control signal; and a plurality of AND devices, a first stage AND device of the AND devices having a first input that is supplied with an output of a first one of the N gate circuits and a second input that is supplied with the test mode signal, and second through Nth stage AND devices of the AND devices respectively having first inputs that are supplied with outputs of second through Nth ones of the N gate circuits, respectively, and second inputs that are supplied with outputs of immediately preceding ones of the first through Nth stage AND devices, respectively.

7. The semiconductor device according to claim 6, further comprising a selection circuit that selects an output of the internal circuit in a normal operation mode and that selects an output of the Nth stage AND device in a test mode, and an output terminal that is supplied with an output of the selection circuit.

8. The semiconductor device according to claim 6, the second inputs of the second through Nth stage AND devices being supplied with outputs of the first through (N−1)th stage AND devices, respectively.

9. The semiconductor device according to claim 6, the internal control signal and an output of the OR device being active at a high level.

10. The semiconductor device according to claim 6, the internal control signal and an output of the OR device being active at a low level.

* * * * *